(12) United States Patent
Orii et al.

(10) Patent No.: US 11,581,192 B2
(45) Date of Patent: *Feb. 14, 2023

(54) ETCHING METHOD AND ETCHING APPARATUS

(71) Applicant: TOKYO ELECTRON LIMITED, Tokyo (JP)

(72) Inventors: Takehiko Orii, Yamanashi (JP); Nobuhiro Takahashi, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/211,393

(22) Filed: Mar. 24, 2021

(65) Prior Publication Data
US 2021/0305056 A1    Sep. 30, 2021

(30) Foreign Application Priority Data

Mar. 30, 2020  (JP) .............................. JP2020-060789

(51) Int. Cl.
| | |
|---|---|
| *H01L 21/311* | (2006.01) |
| *H01L 21/02* | (2006.01) |
| *H01L 21/306* | (2006.01) |
| *H01L 21/67* | (2006.01) |
| *H01L 21/3213* | (2006.01) |

(52) U.S. Cl.
CPC .. *H01L 21/31111* (2013.01); *H01L 21/02164* (2013.01); *H01L 21/30604* (2013.01); *H01L 21/31116* (2013.01); *H01L 21/32135* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 2018/0286744 A1* | 10/2018 | Yamaguchi | ......... H01L 21/6715 |
| 2019/0198349 A1* | 6/2019 | Asada | ................... H01L 21/768 |
| 2020/0312669 A1* | 10/2020 | Takahashi | ......... H01L 21/67069 |

FOREIGN PATENT DOCUMENTS

JP      2016-063141 A      4/2016

* cited by examiner

*Primary Examiner* — Jiong-Ping Lu
(74) *Attorney, Agent, or Firm* — Fenwick & West LLP

(57) ABSTRACT

An etching method is provided. In the etching method, a protective film-forming gas including an amine gas is supplied to a substrate having a surface on which a first film and a second film are formed, the first film and the second film having respective properties of being etched by an etching gas, and a protective film is formed to cover the first film such that the first film is selectively protected between the first film and the second film when the etching gas is supplied. Further, the second film is selectively etched by supplying the etching gas to the substrate after the protective film is formed.

2 Claims, 21 Drawing Sheets

ETCHING METHOD AND ETCHING APPARATUS

CROSS-REFERENCE TO RELATED APPLICATION

This application claims priority to Japanese Patent Application No. 2020-060789, filed on Mar. 30, 2020, the entire contents of which are incorporated herein by reference.

TECHNICAL FIELD

The present disclosure relates to an etching method and an etching apparatus.

BACKGROUND

In constructing a semiconductor device, etching is performed on various films formed on a semiconductor wafer (hereinafter, referred to as a wafer) that is a substrate. For example, Japanese Patent Application Publication No. 2016-63141 discloses that a wafer having an interlayer insulating film, e.g., a low-k film, formed thereon is etched to form a recess for embedding wires in the interlayer insulating film.

SUMMARY

The present disclosure is directed to a technique capable of selectively etching a desired film among a plurality of types of films formed on a surface of a substrate.

In accordance with an aspect of the present disclosure, there is provided an etching method including: supplying a protective film-forming gas including an amine gas to a substrate having a surface on which a first film and a second film are formed, the first film and the second film having respective properties of being etched by an etching gas, and forming a protective film to cover the first film such that the first film is selectively protected between the first film and the second film when the etching gas is supplied; and selectively etching the second film by supplying the etching gas to the substrate after the protective film is formed.

BRIEF DESCRIPTION OF THE DRAWINGS

The objects and features of the present disclosure will become apparent from the following description of embodiments, given in conjunction with the accompanying drawings, in which.

DETAILED DESCRIPTION

First Embodiment

Figure 1:
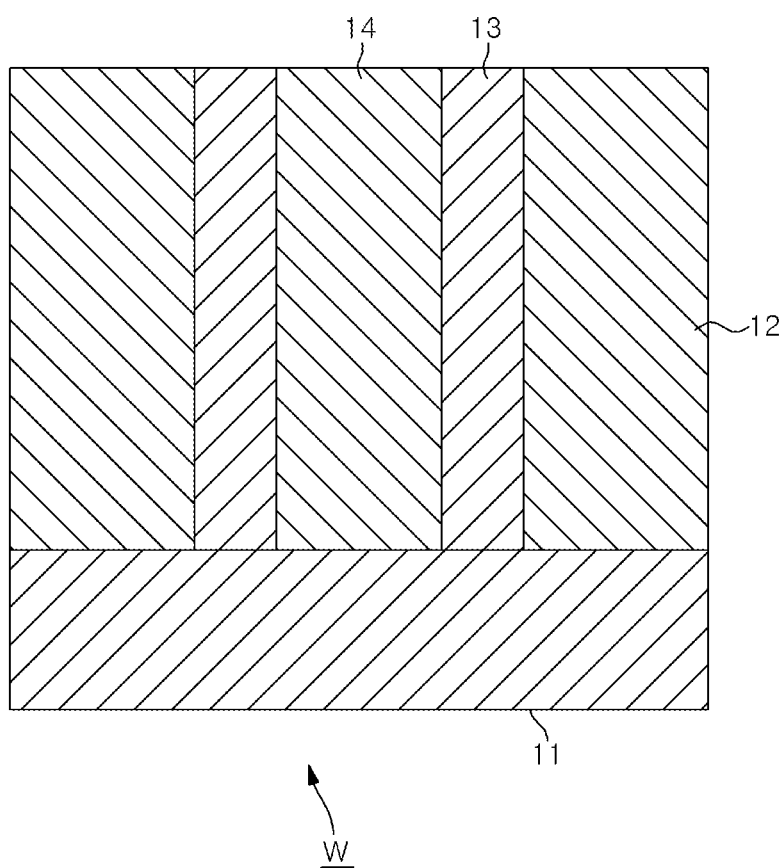
FIG. 1 is a longitudinal cross-sectional view of a surface of a wafer on which etching is performed according to one embodiment according to the present disclosure.

A process according to one embodiment of an etching method of the present disclosure will be described below. FIG. 1 shows a longitudinal cross-sectional view of a surface of a wafer W on which the process is performed. Each of a silicon oxide ($SiO_x$) film 12, a SiOCN film 13, and a polysilicon film 14 is stacked on a lower layer film 11, and each of the films is exposed at the surface of the wafer W. A recess is formed by the lower layer film 11 and the silicon oxide film 12, and the polysilicon film 14 is embedded in the recess. The SiOCN film 13 (that is, a film made of silicon, oxygen, nitrogen, and carbon) is provided between a sidewall of the polysilicon film 14 and a sidewall of the recess so as to surround side surfaces of the polysilicon film 14 and to be in contact with each of the sidewall of the polysilicon film 14 and the sidewall of the recess. Therefore, the polysilicon film 14, the SiOCN film 13, and the silicon oxide film 12 are formed so as to be sequentially adjacent to each other when viewed in a lateral direction (horizontal direction).

The SiOCN film 13 is an interlayer insulating film referred to as a low-k film and is a porous film. Each of the SiOCN film 13 and the silicon oxide film 12 is a film containing oxygen (O) and silicon (Si). The outline of the embodiment will be described. The embodiment is directed to selectively etching the polysilicon film 14 (that is, selectively protecting the silicon oxide film 12) between the polysilicon film 14 and the silicon oxide film 12. For example, as an etching gas, a mixed gas of chlorine trifluoride ($ClF_3$) gas, fluorine ($F_2$) gas, and ammonia ($NH_3$) gas, or iodine heptafluoride ($IF_7$) gas is supplied onto the wafer W. Both the polysilicon film 14 and the silicon oxide film 12 have properties of being etched by the etching gas.

Therefore, in the present embodiment, amine gas is supplied onto the wafer W when etching is performed. As shown in evaluation tests to be described below, an amine adsorption property of the silicon oxide film 12 is higher than an amine adsorption property of the polysilicon film 14, and thus, an amine is scarcely adsorbed onto the polysilicon film 14. By using such difference in adsorption property, amine gas is supplied onto the wafer W to selectively form a protective film, which is made of an amine included in the amine gas, on the silicon oxide film 12 between the silicon oxide film 12 and the polysilicon film 14. When the protective film is formed, an etching gas is supplied onto the wafer W, and the polysilicon film 14 is selectively etched.

In addition, since an amine adsorption property of the SiOCN film 13 is higher than the amine adsorption property of the silicon oxide film 12, the protective film is also formed on a surface of the SiOCN film 13. An amine is also adsorbed onto a porous wall of the SiOCN film 13 to block pores to prevent the passage of an etching gas. Therefore, the protective film is also formed in the pores of the SiOCN film 13. As a result, it is possible to prevent the etching gas from being supplied from a recess in the surface of the wafer W formed by the etching of the polysilicon film 14 through a corresponding pore to a sidewall of the silicon oxide film 12, and thus, it is also possible to prevent the corresponding sidewall from being etched.

Hereinafter, processes performed on the wafer W will be described in sequence with reference to FIGS. 2A to 5B. FIGS. 2A to 5B are schematic diagrams illustrating a state in which the surface of the wafer W described with reference to FIG. 1 is changed according to the processes. The processes shown in FIGS. 2A to 5B are performed in a state in which the wafer W is loaded into a processing chamber and the interior of the processing chamber is evacuated to a vacuum atmosphere at a predetermined pressure. In the FIGS. 2A to 5B, pores formed in the SiOCN film 13 are denoted by reference numeral 15. In addition, an amine supplied onto the wafer W is denoted by reference numeral 21, and in the embodiment, the amine 21 is, for example, butylamine ($C_4H_{11}N$). Furthermore, the etching gas is denoted by reference numeral 22. A protective film formed on a surface of each of the SiOCN film 13 and the silicon oxide film 12 by the amine 21 is denoted by reference numeral 23.

Figure 2A:
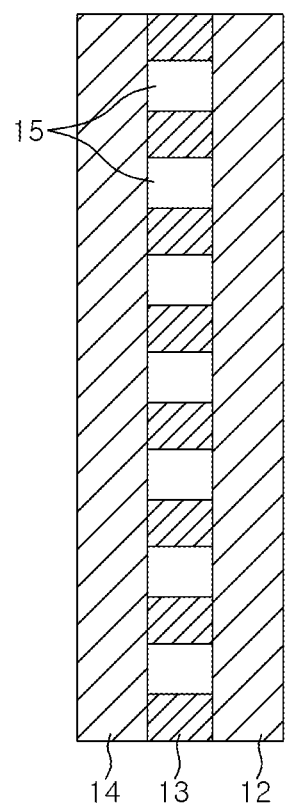
FIGS. 2A to 2C are diagrams for describing processes of the etching.
Figure 2B:
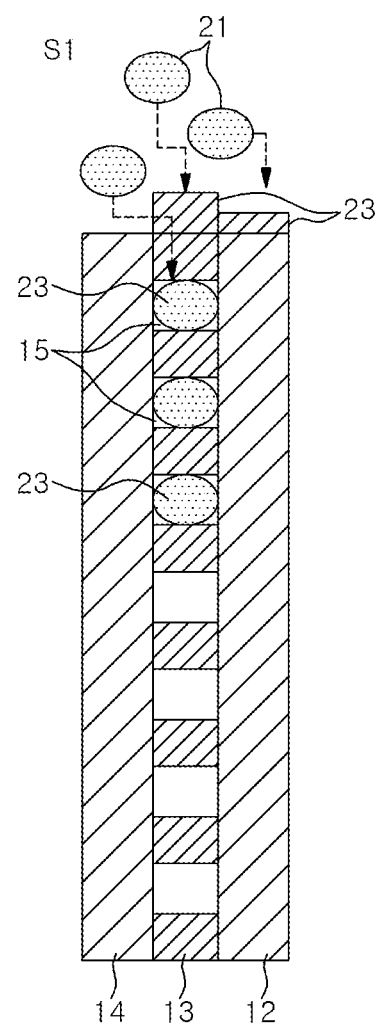

First, amine gas is supplied as the amine 21 into the processing chamber (step S1) (see FIGS. 2A and 2B). As described above, since the amine 21 is easily adsorbed onto the SiOCN film 13 and the silicon oxide film 12, the amine 21 is adsorbed onto a surface (upper surface) of each of the films, and thus, the protective film 23 is formed. While the protective film 23 is formed as described above, the amine 21 is adsorbed onto the porous wall of the SiOCN film 13 and remains in the pores 15 to block the pores 15. Therefore, as described above, the protective film 23 is also formed in the pores 15.

Figure 2C:
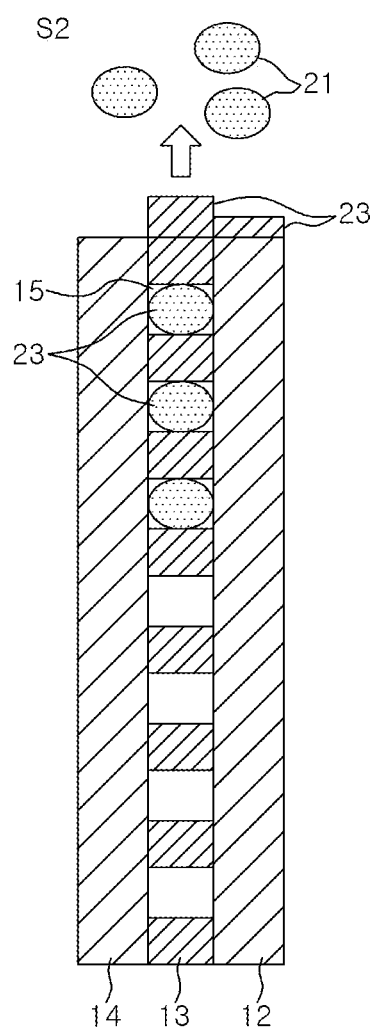

Subsequently, the supply of the amine gas into the processing chamber is stopped, and evacuation and the supply of a purge gas, for example, nitrogen ($N_2$) gas, are performed in the processing chamber (step S2) (see FIG. 2C). As a result, the amine gas, which does not flow into the pores 15 and does not form the protective film 23, is removed along an air flow of the discharged purge gas.

Figure 3A:
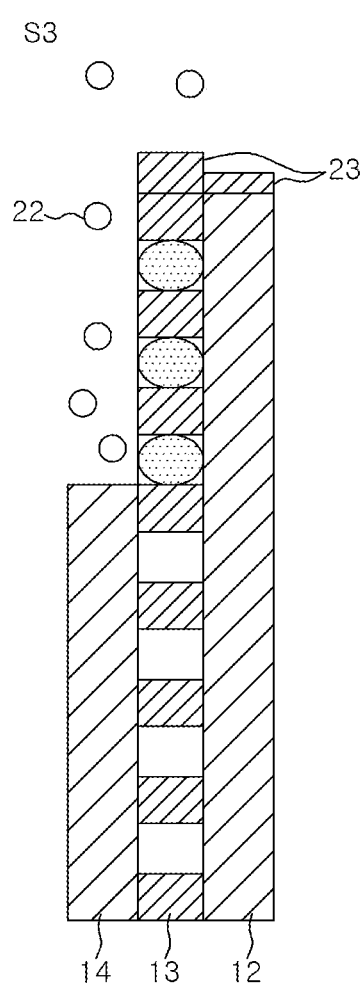
FIGS. 3A and 3B are diagrams for describing processes of the etching.
Figure 3B:
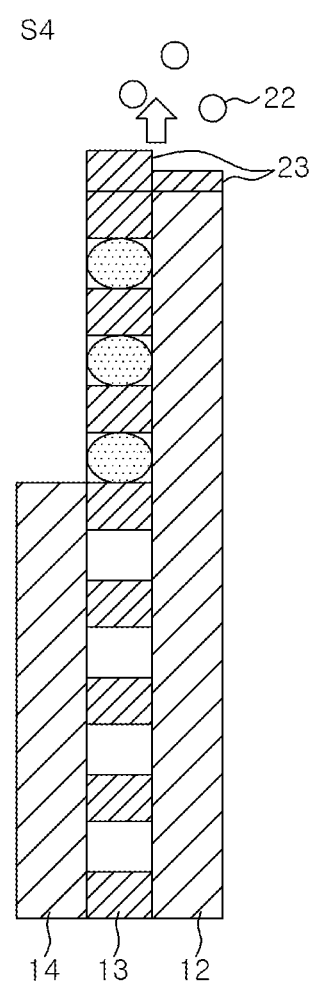
Figure 4A:
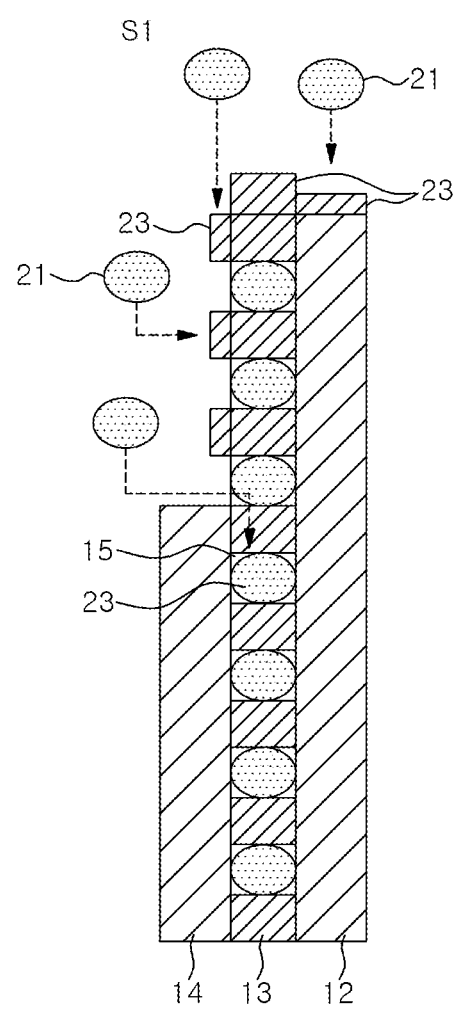
FIGS. 4A and 4B are diagrams for describing processes of the etching.
Figure 4B:
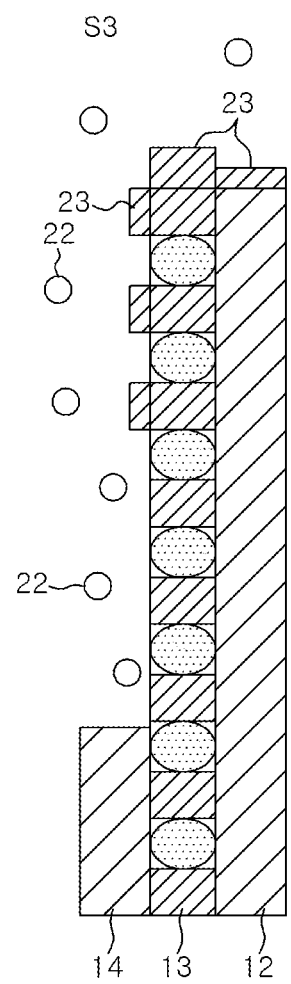
Figure 5A:
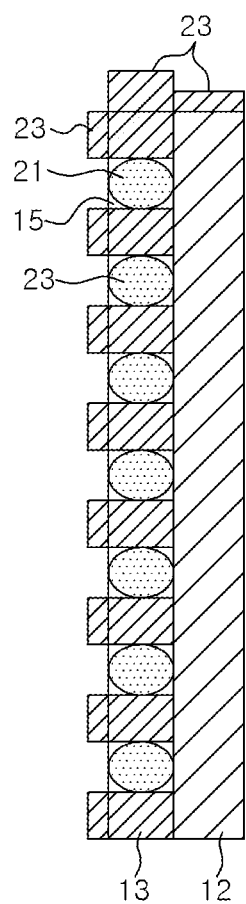
FIGS. 5A and 5B are diagrams for describing processes of the etching.
Figure 5B:
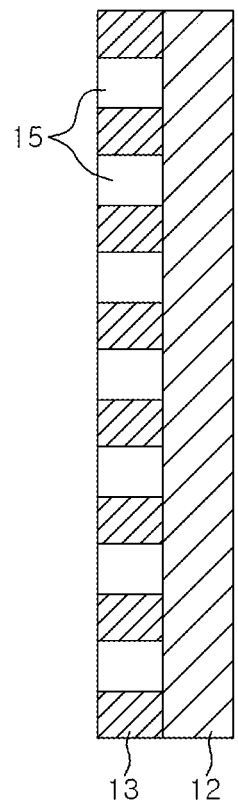

Next, the etching gas 22 is supplied into the processing chamber, the polysilicon film 14 which is not covered with the protective film 23 is etched, and thus, an upper sidewall of the SiOCN film 13 is exposed (step S3) (see FIG. 3A). On the other hand, since the protective film 23 is formed, the SiOCN film 13 and the silicon oxide film 12 are prevented from being etched from above. In addition, since the pores 15 at an upper side of the SiOCN film 13 are blocked by the amine 21, the etching gas 22 is also prevented from passing through the pores 15 such that the etching gas 22 cannot be supplied to the sidewall of the silicon oxide film 12. Thereafter, the supply of the etching gas 22 into the processing chamber is stopped, and evacuation and the supply of a purge gas are performed in the processing chamber (step S4) (see FIG. 3B). The etching gas 22 remaining in the processing chamber is removed along an air flow of the purge gas discharged from the processing chamber.

Subsequently, amine gas is supplied into the processing chamber. That is, step S1 is performed again. In step S3, the polysilicon film 14 is etched, and thus, the upper sidewall of the SiOCN film 13 is exposed. Therefore, the amine 21 in a gas supplied in second step S1 is supplied to the lower pores 15 below the pores 15 of the SiOCN film 13, to which the amine 21 is supplied in first step S1, and is adsorbed onto the porous wall to block the pores (see FIG. 4A). In addition, the protective film 23 is also formed on the exposed sidewall of the SiOCN film 13.

Thereafter, evacuation and the supply of a purge gas are performed in the processing chamber in step S2 again. Subsequently, the etching gas 22 is supplied into the processing chamber in step S3, and the polysilicon film 14 is etched downward, and an exposed region of the sidewall of the SiOCN film 13 is expanded downward. Even in this case, the protective film 23 is formed as in the first etching so that the SiOCN film 13 and the silicon oxide film 12 are prevented from being etched from above.

In addition, by second step S1, a region of the SiOCN film 13, to which the amine 21 is supplied, is expanded downward, and thus, the amine 21 remains in the pores 15 near the sidewall of the SiOCN film 13 newly exposed due to the etching of the polysilicon film 14. Therefore, also in second step S3, the etching gas is prevented from passing through the pores 15 of the SiOCN film 13 such that the etching gas cannot etch the silicon oxide film 12 (see FIG. 4B). After the etching, the evacuation and the supply of the purge gas in step S4 are performed again.

Assuming that steps S1 to S4 sequentially performed as described above are regarded as one cycle, for example, the cycle is repeated even after the aforesaid second step S4 is performed. As a result, the polysilicon film 14 is etched downward while the SiOCN film 13 and the silicon oxide film 12 are prevented from being etched. After a predetermined number of cycles are completed and the entirety of the polysilicon film 14 is etched (see FIG. 5A), the wafer W may be heated (step S5). Due to the heating, the amine 21 that enters the pores 15 and the amine 21 that forms the protective film 23 are vaporized and removed from the wafer W (see FIG. 5B).

Figure 6:
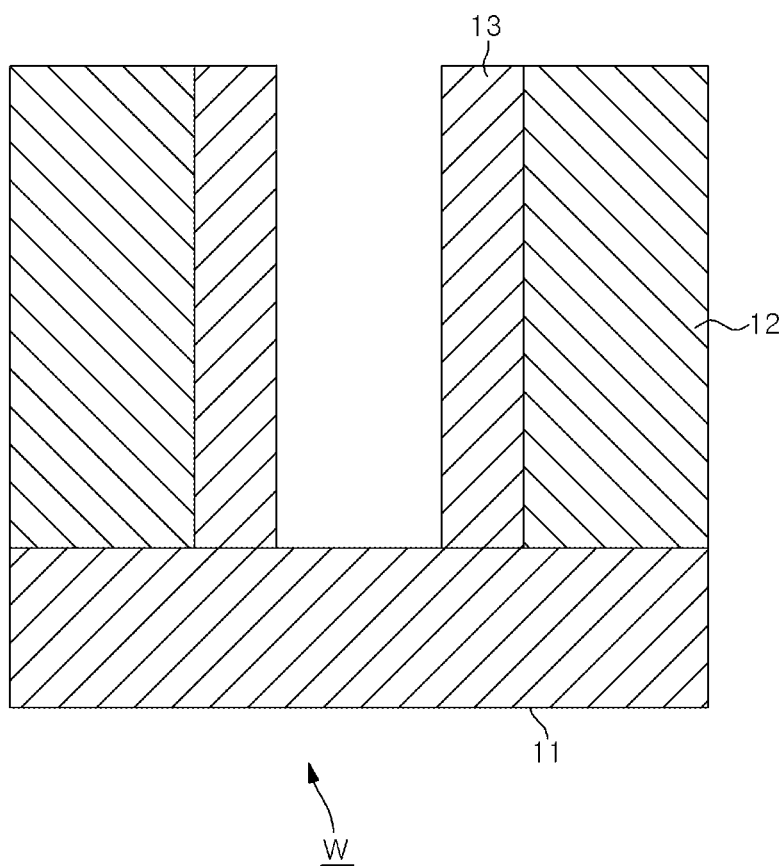
FIG. 6 is a longitudinal cross-sectional view of a surface of a wafer after etching.

In addition, in a series of the above-described processes, it has been described that the amine 21 remains on the surface of the wafer W during etching, but it is also conceivable that the amine 21 may react with the etching gas 22 to become a reaction product and to remain on the surface of the wafer W. As such, the amine 21 may remain as the reaction product. When such reaction product is generated, heating is performed so that the reaction product can be removed in step S5. That is, the heating in step S5 is heating for removing the amine 21 and/or the reaction product, and specifically, the wafer W is heated to, for example, a temperature of 100° C. to 400° C. FIG. 6 illustrates the surface of the wafer W after step S5 is performed, and for example, a gate of a semiconductor device is formed in a recess 17, which is formed by removing the polysilicon film 14, in a subsequent process.

According to the processes of the above described embodiment, by using difference in adsorption property of amines between the silicon oxide film 12 and the polysilicon film 14, the protective film 23 is selectively formed on the silicon oxide film 12 between the films. In a state in which the protective film 23 is formed as described above, the etching gas 22 is supplied onto the wafer W, thereby selectively etching the polysilicon film 14 between the silicon oxide film 12 and the polysilicon film 14, that is, the silicon oxide film 12 is prevented from being etched. In addition, since the protective film 23 is also formed in the pores 15 of the porous film 13, the etching gas 22 can also be prevented from passing through the pores 15 such that the etching gas 22 cannot etch the sidewall of the silicon oxide film 12, thereby more reliably protecting the silicon oxide film 12.

The gas flow of the exhaust gas exhausted from the processing chamber may be constant in steps S1 to S4 described above, and gas flows of the exhaust gases in steps S2 and S4 for removing unnecessary gases in the processing chamber may be greater than those in steps S1 and S3 in order to more reliably remove the gases. Alternatively, in steps S2 and S4, unnecessary gases may be removed only through evacuation without supplying a purge gas.

A film structure of the wafer W shown in FIG. 1 is merely exemplary, and a Si film to be etched is not limited to the polysilicon film 14 and may be, for example, an amorphous silicon (α-Si) film. In addition, a porous film is not limited to the SiOCN film 13, and a porous film such as a SiCO film or a SiCOH film may be formed instead of the SiOCN film 13. As shown in the evaluation tests, since an amine is easily adsorbed onto an oxygen-containing silicon film (film containing silicon and oxygen), the porous film may include oxygen in order to adsorb the amine. Here, the term "containing oxygen" does not mean that oxygen is contained as an impurity but means that oxygen is contained as a component constituting a film. In addition, the term "containing silicon" means that silicon is contained as a component constituting a film.

Figure 7A:
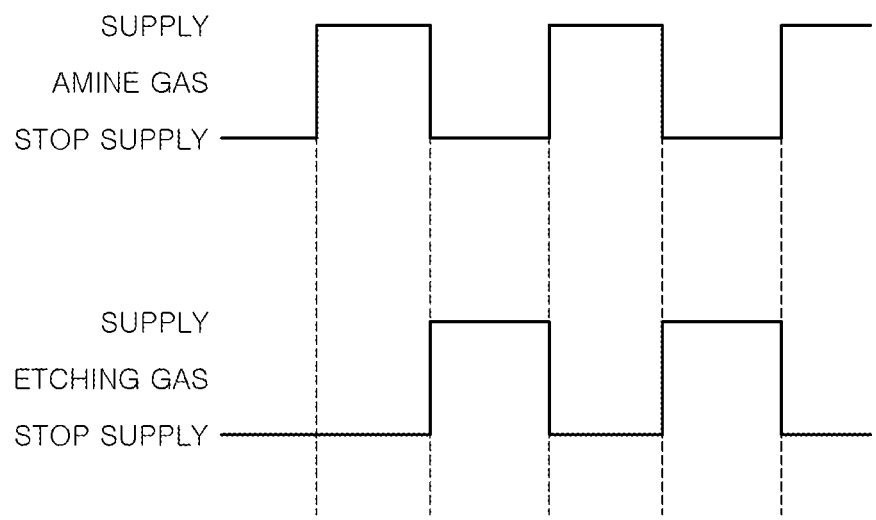
FIGS. 7A and 7B are timing charts showing examples of gas supply timings during etching.

In the above-described embodiment, steps S1 to S4 are shown to be repeated three or more times, but the number of repetitions is not limited to this example, and may be, for example, two. Furthermore, steps S1 to S4 may be performed only once without being repeated. However, steps S2 and S4 for removing unnecessary gases may be omitted. Specifically, as shown in FIG. 7A showing timings of supplying an amine gas and an etching gas into the processing chamber, without an interval after the supply of one of the amine gas and the etching gas is ended, the other gas may be supplied. In addition, even when steps S2 and S4 are omitted as described above, steps S1 and S3 of respectively supplying the amine gas and the etching gas are not limited to being repeatedly performed and may be performed only once.

Figure 7B:
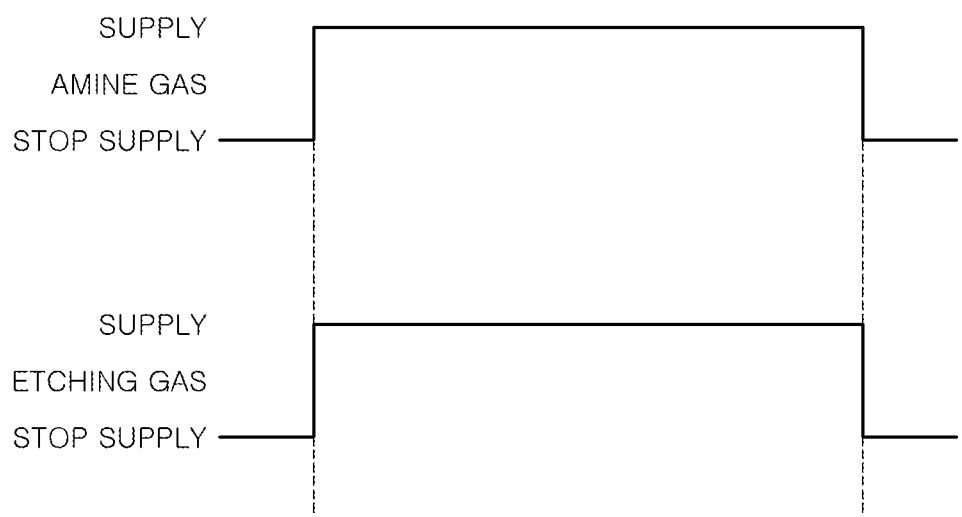

In addition, the amine gas and the etching gas 22 are not limited to being supplied in sequence. That is, although it is possible to start supplying one of the amine gas and the etching gas 22 after the supply of the other gas is finished, it is also possible to simultaneously supply the amine gas and the etching gas to process the wafer W as shown in FIG. 7B. As described above, when the amine gas and the etching gas 22 are simultaneously supplied, the formation of the protective film 23 and the etching of the polysilicon film 14 are performed in parallel.

As described above, in step S5, the wafer W is heated such that the amine 21 and/or a reaction product of the amine 21 and $F_2$ are removed from the SiOCN film 13. However, although the amine 21 and/or the reaction product are adsorbed onto the surfaces of the SiO film 12 and the SiOCN film 13 (including surfaces of the pores), when there is no problem in processing of a subsequent process or in practical use of a product, the amine 21 and/or the reaction product may remain as such. Therefore, heat treatment in step S5 is not necessarily essential.

In addition, the amine 21 constituting the amine gas is not limited to butylamine. Specific examples thereof may include hexylamine, dipropylamine, n-octylamine, tert-butylamine, decylamine, dodecylamine, dicyclohexylamine, tetradecylamine, and the like. A boiling point of each of the above-described amines is in a range of 100° C. to 400° C. Therefore, in order to remove the amine in a vaporized state in step S5 of the above-described embodiment, the wafer W may be heated to a temperature of 100° C. to 400° C.

Hereinafter, a substrate processing apparatus 3 for performing a series of the above-described processes will be described with reference to a plan view of FIG. 8. The substrate processing apparatus 3 includes a loading/unloading unit 31 for loading or unloading wafers W, two load lock chambers 41 provided adjacent to the loading/unloading unit 31, two heat treatment modules 40 provided adjacent to the two load lock chambers 41, and two etching modules 5 provided adjacent to the two heat treatment modules 40.

The loading/unloading unit 31 includes a normal pressure transfer chamber 33 where a normal pressure atmosphere is maintained and a first substrate transfer unit 32 is disposed therein, and a carrier mounting table 35 provided on a long side of the normal pressure transfer chamber 33 to mount carriers 34 for accommodating the wafer W. In FIG. 8, reference numeral 36 denotes an orienter chamber disposed on a short side of the normal pressure transfer chamber 33, and the orienter chamber 36 is provided to rotate the wafer W to optically obtain an amount of eccentricity and align a position of the wafer W with respect to the first substrate transfer mechanism 32. The first substrate transfer mechanism 32 transfers the wafer W between the carrier 34 on the carrier mounting table 35, the orienter chamber 36, and the load lock chamber 41.

In each load lock chamber 41, for example, a second substrate transfer mechanism 42 having an articulated arm structure is provided, and the second substrate transfer mechanism 42 transfers the wafer W between the load lock chamber 41, the heat treatment module 40, and the etching module 5. The interior of a processing chamber of the heat treatment module 40 and the interior of a processing chamber of the etching module 5 are under a vacuum atmosphere, and the interior of the load lock chamber 41 is converted between a normal pressure atmosphere and a vacuum atmosphere so as to transfer the wafer W between the interiors of the processing chambers under the vacuum atmosphere and the normal pressure transfer chamber 33.

Figure 8:
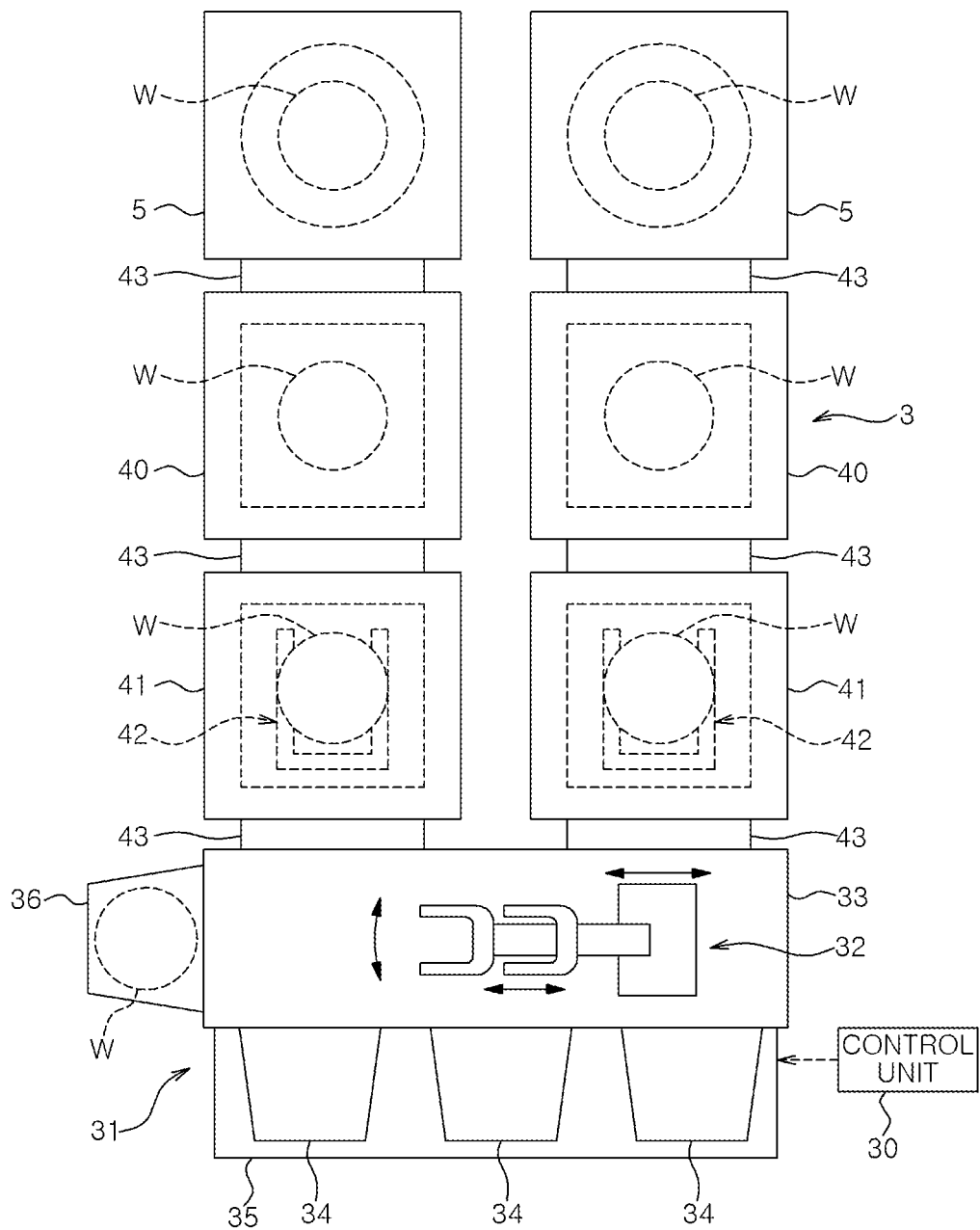
FIG. 8 is a plan view of a substrate processing apparatus for performing etching.

In FIG. 8, reference numeral 43 denotes openable/closable gate valves, and each of the gate valves 43 is provided between the normal pressure transfer chamber 33 and the load lock chamber 41, between the load lock chamber 41 and the heat treatment module 40, and between the heat treatment module 40 and the etching module 5. The heat treatment module 40 includes the above-described processing chamber, an exhaust mechanism for evacuating the interior of the processing chamber to form a vacuum atmosphere, a mounting table installed in the processing chamber and capable of heating the wafer W loaded thereon, and the like, so as to be configured to perform step S5.

Figure 9:
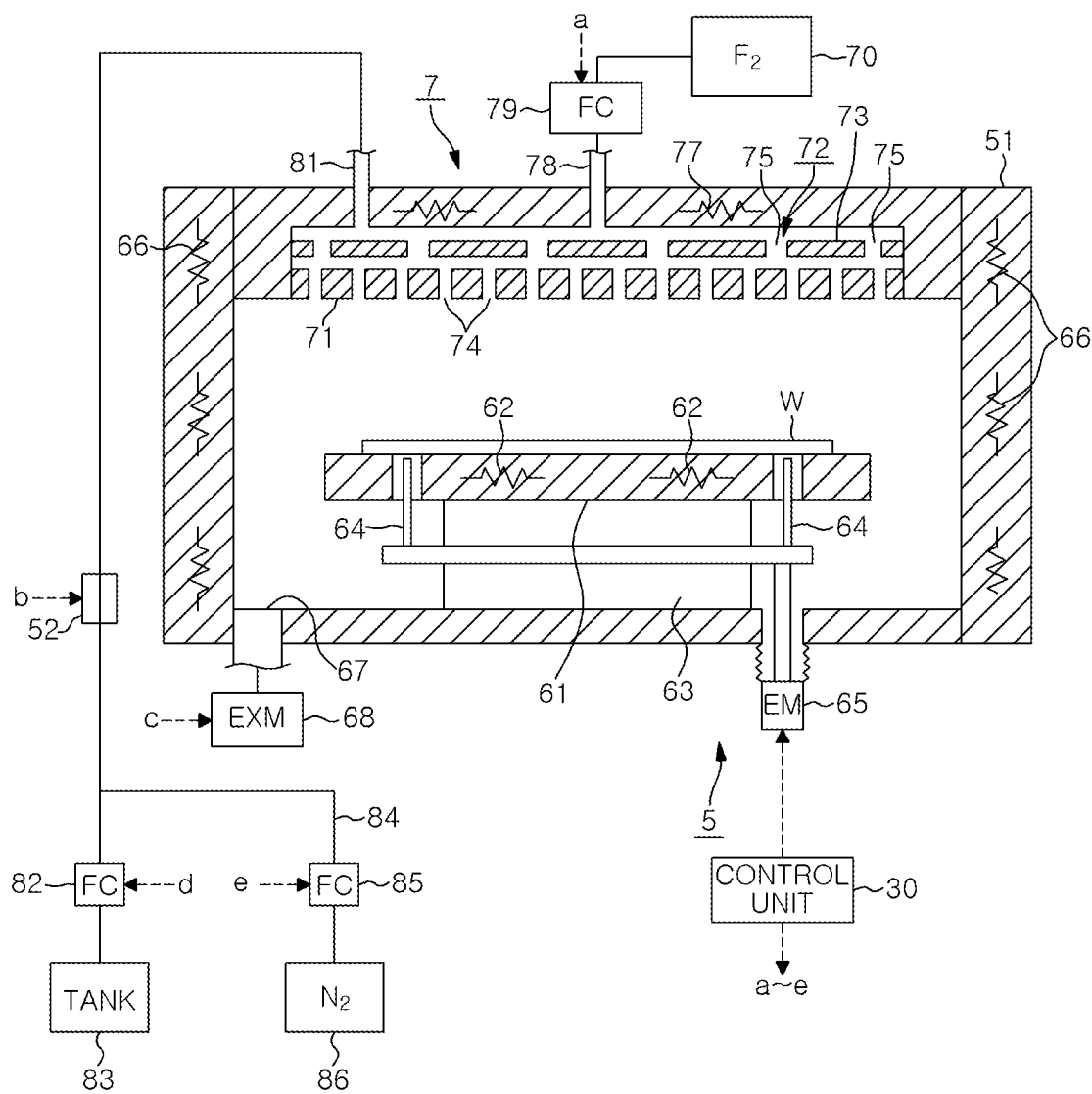
FIG. 9 is a longitudinal cross-sectional view of an etching module provided in the substrate processing apparatus.

Subsequently, the etching module 5 will be described with reference to a longitudinal cross-sectional view of FIG. 9. The etching module 5 is a module that performs the processes of steps S1 to S4 on the wafer W and includes, for example, a circular processing chamber 51. That is, the processes of steps S1 to S4 are performed in the same processing chamber. The processing chamber 51 is an airtight vacuum chamber. At a lower side of the processing chamber 51, a circular mounting table (stage) 61 having a horizontally formed surface (upper surface) for loading the wafer W is provided. In FIG. 9, reference numeral 62 denotes a stage heater embedded in the mounting table 61, and the stage heater heats the wafer W to a predetermined temperature such that the processes of steps S1 to S4 may be performed. In FIG. 9, reference numeral 63 denotes a support that supports a mounting unit such as the mounting table 61 on a bottom surface of the processing chamber 51. In FIG. 9, reference numeral 64 denotes vertical elevation pins, and the vertical elevation pin 64 protrudes and retracts from a surface of the mounting table 61 by an elevation mechanism 65 to transfer the wafer W between the second substrate transfer mechanism 42 and the mounting table 61.

Although three elevation pins 64 are installed, only two elevation pins 64 are illustrated in FIG. 9.

In FIG. 9, reference numeral 66 denotes a sidewall heater provided in a sidewall of the processing chamber 51, and the sidewall heater 66 adjusts an atmospheric temperature inside the processing chamber 51. In addition, an openable/closable transfer port (not shown) for the wafer W is provided in the sidewall of the processing chamber 51. In FIG. 9, reference numeral 67 denotes an exhaust port that is open in the bottom surface of the processing chamber 51, and the exhaust port 67 is connected to an exhaust mechanism (EXM) 68, which includes a vacuum pump, a valve, and the like, through an exhaust pipe. A pressure in the processing chamber 51 is adjusted by adjusting the gas flow exhausted through the exhaust port 67 by the exhaust mechanism 68.

A gas shower head 7 constituting a protective film-forming gas supply unit and an etching gas supply unit is provided on a ceiling of the processing chamber 51 above the mounting table 61 so as to face the mounting table 61. The gas shower head 7 includes a shower plate 71, a gas diffusion space 72, and a diffusion plate 73. The shower plate 71 is horizontally installed so as to form a lower surface of the gas shower head 7, and a plurality of gas discharge holes 74 are dispersed and formed therein in order to discharge gases onto the mounting table 61 in a shower form. The gas diffusion space 72 is a flat space formed so that a lower side thereof is divided by the shower plate 71 in order to supply gases to each gas discharge hole 74. The diffusion plate 73 is horizontally installed so as to vertically divide the gas diffusion space 72. In FIG. 9, reference numeral 75 denotes through-holes formed in the diffusion plate 73, and a plurality of through-holes 75 are dispersed and pass through the diffusion plate 73. In FIG. 9, reference numeral 77 denotes a ceiling heater, and the ceiling heater 77 adjusts a temperature of the gas shower head 7.

Downstream ends of gas supply pipes 78 and 81 are connected to an upper side of the gas diffusion space 72. An upstream side of the gas supply pipe 78 is connected to an $F_2$ gas supply source ($F_2$) 70 through a flow controller (FC) 79. The flow controller 79 includes a valve and a mass flow controller and adjusts a gas flow of a gas supplied to a downstream side of the gas supply pipe 78. In addition, each flow controller to be described below has the same configuration as the flow controller 79 and adjusts a gas flow of a gas supplied to a downstream side of a pipe in which the flow controller is installed.

An upstream side of the gas supply pipe 81 is connected to a tank 83 for storing a liquid amine through a flow controller (FC) 82. The tank 83 is provided with a heater that heats and vaporizes the amine therein. The tank 83 may be configured to supply the vaporized amine (amine gas) to a downstream side of the gas supply pipe 81. In addition, for example, the gas supply pipe 81 is branched off from an upstream side of the flow controller 82 to form a gas supply pipe 84. The gas supply pipe 84 is connected to an $N_2$ gas supply source ($N_2$) 86 through a flow controller (FC) 85. Therefore, amine gas and $N_2$ gas may each independently be supplied to the gas shower head 7.

A correspondence between steps S1 to S4 performed in the etching module 5 and gases supplied from the gas shower head 7 will be described. In step S1, amine gas is supplied to the gas shower head 7 from the tank 83 and is supplied into the processing chamber 51. In steps S2 and S4, $N_2$ gas is supplied to the gas shower head 7 from the $N_2$ gas supply source 86 and is supplied into the processing chamber 51 as a purge gas. In step S3, the supplies of the gases from the tank 83 and the $N_2$ gas supply source 86 are stopped, and $F_2$ gas is supplied to the gas shower head 7 from the supply source 70 and is supplied into the processing chamber 51.

Meanwhile, as shown in FIGS. 8 and 9, the substrate processing apparatus 3 includes a control unit 30 which is a computer, and the control unit 30 includes a program, a memory, and a central processing unit (CPU). The program includes instructions (each step) so as to process the wafer W and transfer the wafer W, and the program is stored in a computer storage medium such as a compact disc, a hard disk, or a magneto-optical disk, or a digital versatile disc (DVD) and installed in the control unit 30. The control unit 30 outputs a control signal to each unit of the substrate processing apparatus 3 and controls the operation of each unit through the program. Specifically, the operation of the etching module 5, the operation of the heat treatment module 40, the operation of the first substrate transfer mechanism 32, the operation of the second substrate transfer mechanism 42, and the operation of the orienter chamber 36 are controlled through control signals. The operation of the etching module 5 includes operations of adjusting the output of each heater, stopping the supply of each gas from the gas shower head 7, adjusting the exhausted gas flow of the exhaust mechanism 68, and elevating the elevation pin 64 by the elevation mechanism (EM) 65. The control unit 30 and the etching module 5 constitute an etching apparatus.

A transfer route of the wafer W in the substrate processing apparatus 3 will be described. As described with reference to FIG. 1, the carrier 34, which loads the wafer W having each film formed thereon, is placed on the carrier mounting table 35. The wafer W is transferred in the order of the normal pressure transfer chamber 33→the orienter chamber 36→the normal pressure transfer chamber 33→the load lock chamber 41 and is transferred to the etching module 5 through the heat treatment module 40. Then, as described above, a cycle including steps S1 to S4 is repeatedly performed to process the wafer W. Subsequently, the wafer W is transferred to the heat treatment module 40 and subjected to the process of step S5. Thereafter, the wafer W is transferred in the order of the load lock chamber 41→the normal pressure transfer chamber 33 and is returned to the carrier 34.

The supply of the amine gas and the supply of the etching gas may be performed in different processing chambers, and the wafer W may be transferred between the processing chambers by a transfer mechanism. However, it is possible, by supplying the gases in the same processing chamber, to eliminate the time taken for the wafer W to be transferred between the modules when the above described cycle is performed. Therefore, throughput can be improved by the configuration of the substrate processing apparatus 3.

In the above-described embodiment, an example has been described in which the polysilicon film 14 is selectively etched using difference in amine adsorption property between a first film, i.e., the silicon oxide film 12, and a second film, i.e., the polysilicon film 14, but as shown in the evaluation tests to described below, amines exhibit different adsorption properties with respect to various compounds. Therefore, a combination of a first film (film to be protected) and a second film (film to be etched) is not limited to the silicon oxide film 12 and the polysilicon film 14.

Figure 10A:
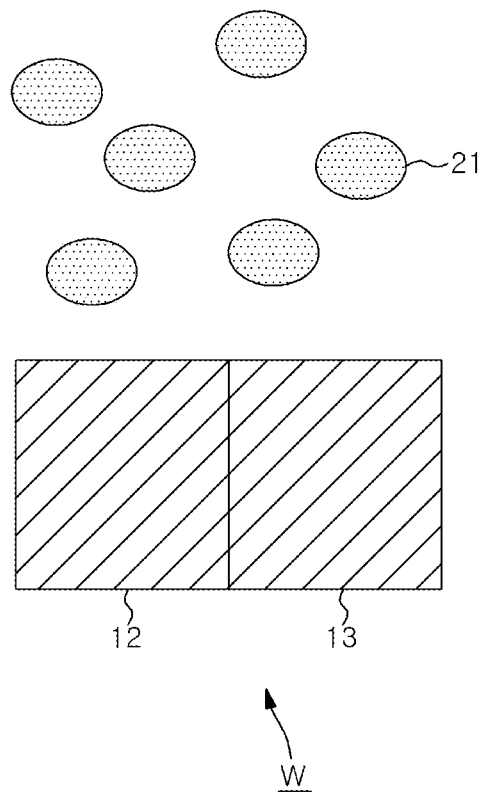
FIGS. 10A to 10C are diagrams for describing processes of the etching.
Figure 10B:
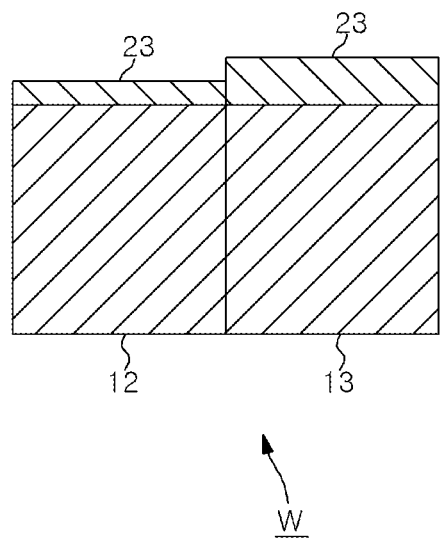
Figure 10C:
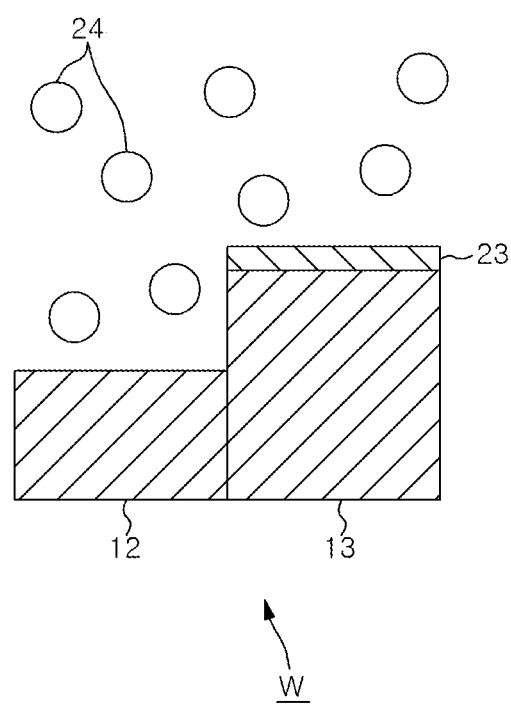

FIGS. 10A to 10C illustrate a wafer W having a surface on which a silicon oxide film 12 and a SiOCN film 13, each of which is a silicon film containing oxygen, are formed. As shown in the evaluation tests, there is a relatively great difference in adsorption property of an amine 21 between the silicon oxide film 12 and the SiOCN film 13, and the adsorption property of the SiOCN film 13 is higher. Therefore, when amine gas is supplied onto the wafer W (see FIG. 10A), a film thickness of a protective film 23 formed on the SiOCN film 13 is greater than a film thickness of the protective film 23 formed on the silicon oxide film 12 (see FIG. 10B). In a state in which the protective film 23 is formed on each of the silicon oxide film 12 and the SiOCN film 13 as described above, an etching gas 24 having etching properties with respect to the silicon oxide film 12 and the SiOCN film 13 is supplied onto the wafer W.

Since the film thickness of the protective film 23 on the silicon oxide film 12 is small, the protective film 23 is removed by the etching gas 24, and a surface of the silicon oxide film 12 is etched. While the silicon oxide film 12 is etched as described above, the protective film 23 remains on the SiOCN film 13, and the SiOCN film 13 is prevented from being etched (see FIG. 10C). As shown in examples of FIGS. 10A to 10C, when a second film between first and second films is selectively etched, the protective film 23 may be formed on the second film as long as a sufficient film thickness difference is formed between the first film and the second film and such selective etching is possible. That is, although FIGS. 2A to 5B illustrate that the protective film is formed only on the first film of the first film and the second film, the protective film is not limited to being formed only on one film of the films as such, and the protective film may be formed on the films so as to have different thicknesses. In addition, the etching gas 24 may be any gas capable of etching the silicon oxide film 12 and may be, for example, a mixed gas of hydrogen fluorine (HF) gas and ammonia ($NH_3$) gas.

A series of processes including adsorbing and etching shown in FIGS. 10A to 10C are performed on the wafer W, for example, at a temperature of 30° C. to 130° C. at a pressure of 1.33 Pa (10 mTorr) to $1.33 \times 10^3$ Pa (Torr) in the processing chamber 51. Such process conditions for processing the silicon oxide film 12 may also be applied to a case where a series of processes including adsorbing and etching are performed on the polysilicon film 14 described with reference to FIGS. 2A to 4B. Further, when to replenish the silicon oxide film 12, the silicon oxide film 12 may be formed by heating Si under an oxygen atmosphere or may be formed through chemical vapor deposition (CVD) or atomic layer deposition (ALD).

As examples of other combinations of the first film and the second film, an amine adsorption property is very low for a Si (polysilicon and α-Si) film described above, and an amine adsorption property is also low for a silicon nitride (SiN) film, which is at the same as with the Si film. Therefore, for example, amine gas and an etching gas 22 are supplied onto the surface of the wafer W in which the SiN film and the silicon oxide film 12 are formed on the surface thereof, and the SiN film of the SiN film and the silicon oxide film 12 may be selectively etched with the etching gas 22. In addition, the first film to be protected is not limited to a silicon-containing film. Amines exhibit a relatively high adsorption property with respect to metal films of titanium (Ti), titanium nitride (TiN)), tungsten (W), and the like. Therefore, the etching gas may be supplied onto the wafer W in which at least one of the metal films and a silicon-containing film such as a Si film are formed on the surface thereof, thereby selectively etching the silicon-containing film. In addition, the present technique is not limited to the combination of the films described above and may be applied to a case where at least two types of films having different amine adsorption properties are formed on the surface of the wafer W, and the film having the lower adsorption property between the two types of films is selectively etched.

In addition, an etching gas is not limited to the above-described $ClF_3$ gas and may be appropriately changed according to a film to be etched.

Second Embodiment

A second embodiment will be described focusing on differences from the first embodiment. In the second embodiment, the above-described protective film against etching is formed by supplying amine gas and isocyanate gas to a wafer W. More specifically, by supplying the amine gas and the isocyanate gas for forming a protective film, a compound having a urea bond, which is a reaction product of the gases, is formed on a surface of the wafer W. As shown in the evaluation tests to be described below, when a certain amount of each of the amine gas and the isocyanate gas is supplied, an adsorption amount of the compound having the urea bond differs for each film on the surface of the wafer W. That is, thicknesses of formed protective films are different according to types of films as in the case of using an amine. In addition, here, difference in thickness of the protective film also includes that, between two types of films on the surface of the wafer W, the protective film is formed on a surface of one film and the protective film is not formed on a surface of the other film. Similar to the first embodiment, in the second embodiment, etching is selectively performed using the protective films having such different thicknesses.

Figure 11A:
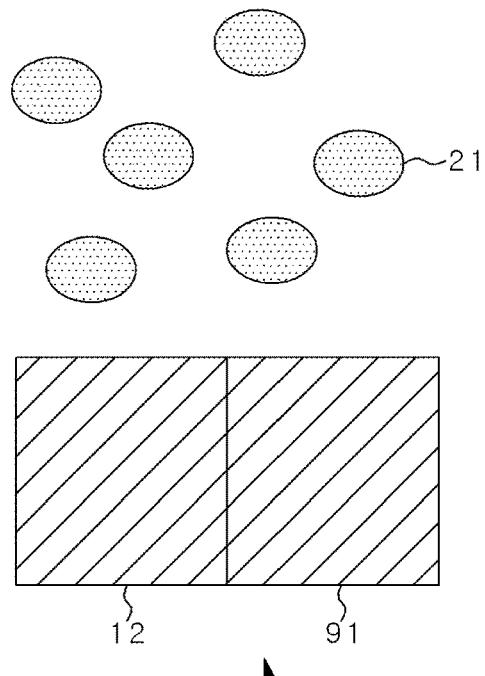
FIGS. 11A to 11C are diagrams for describing processes of the etching.
Figure 11B:
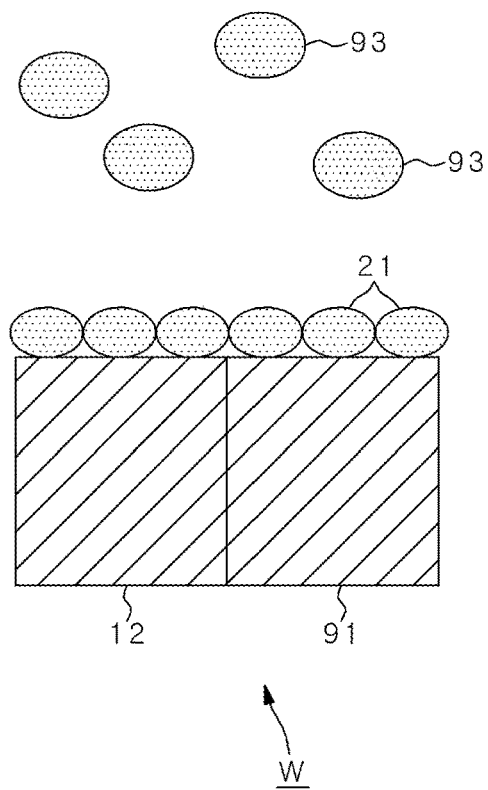
Figure 11C:
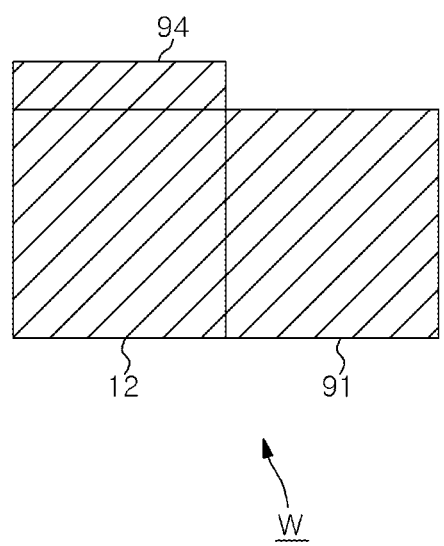

Describing a specific processing example, FIG. 11A illustrates a wafer W having a surface on which an α-Si film 91 and a silicon oxide film 12 are formed. A gaseous amine 21 (amine gas) is supplied onto the wafer W (step T1) and adsorbed onto a surface of the wafer W. Next, the same purging as in step S2 is performed to remove unnecessary amine gas (step T2). Subsequently, as shown in FIG. 11B, a gaseous isocyanate 93 (isocyanate gas) is supplied onto the wafer W and adsorbed onto the surface of the wafer W (step T3). Thereafter, the same purging as in step S2 is performed to remove unnecessary isocyanate gas (step T4). A compound is formed on the surface of wafer W through a reaction between the amine 21 and the isocyanate 93, and the compound exhibits a low adsorption property with respect to the α-Si film 91 and exhibits a high adsorption property with respect to the silicon oxide film 12. Therefore, the compound remains adsorbed onto a protective film 94 on the silicon oxide film 12 but does not remain on the α-Si film 91 (see FIG. 11C).

Figure 12:
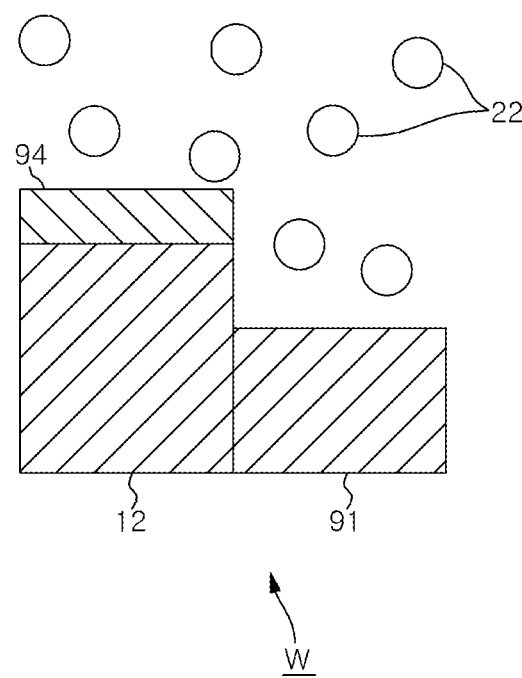
FIG. 12 is a diagram for describing a process of the etching.

Thereafter, as in step S3, an etching gas is supplied onto the wafer W, and the α-Si film 91 is etched. Since the silicon oxide film 12 is covered with the protective film 94, the silicon oxide film 12 is not etched. That is, the α-Si film 91 is selectively etched (step T5) (see FIG. 12). Thereafter, the same purging as in step S4 is performed to remove an unnecessary etching gas (step T6). For example, the processes of steps T1 to T6 are repeatedly performed to etch the α-Si film 91 downward. When steps T1 to T6 are repeated a preset number of times, the same heat treatment as in step S5 is performed on the wafer W (step T7). The heat treatment in step T7 is treatment of depolymerizing a compound constituting the protective film 94 to vaporize and remove the compound. In order to perform the depolymerizing, for example, the wafer W is heated to have a temperature of 100° C. to 400° C. as in step S5.

A timing of supplying amine gas to the wafer W and a timing of supplying isocyanate gas to the wafer W are not limited to being different as in the above processing example, and the gases may be supplied at the same timing. In addition, as in the first embodiment, a timing of supplying amine gas and isocyanate gas, which are gases for forming a protective film, may be the same as a timing of supplying an etching gas. That is, etching may be performed while the protective film 94 is formed. In such case, after the amine gas, the isocyanate gas, and the etching gas are supplied, a purge gas is supplied. In addition, a cycle including supplying the amine gas, the isocyanate gas, and the etching gas and supplying the purge gas may be repeated. Furthermore, when the amine gas and the isocyanate gas are supplied in sequence, the amine gas is supplied first in the examples described with reference to FIGS. 11A to 12, but the isocyanate gas may be supplied first.

When the processes of the second embodiment are performed, for example, in addition to a tank 83 for supplying amine gas to a gas shower head 7, a tank 83 for supplying isocyanate gas to the gas shower head 7 may be installed in an etching module 5 described above. A piping system may be configured such that a gas may be separately supplied from each tank 83.

As each of an amine and an isocyanate used in the processes of the second embodiment, monofunctional molecules may be used. That is, as the amine, a compound having only one amino group may be used, and as the isocyanate, a compound having only one isocyanate group may be used. Therefore, a compound constituting a passage prevention film formed in a porous film 13 may be a compound having one urea bond. In addition, a process may be performed using an amine having a plurality of amino groups and an isocyanate having a plurality of isocyanate groups. Therefore, a compound constituting the protective film 94 may be polyurea having a plurality of urea bonds.

Examples of the amine used in the second embodiment may include 1,3-bis(aminomethyl)cyclohexane (H6XDA), 1,12-diaminododecane (DAD), hexamethylenediamine, 1,6-diaminohexane, cyclohexylamine, hexylamine, butylamine, tert-butylamine, and the like. Examples of the isocyanate are also given. 1,3-bis(isocyanatemethyl)cyclohexane (H6XDI), tert-butyl isocyanate, 4,4'-diphenylmethane diisocyanate (MDI), 1,6-diisocyanate hexane, cyclohexyl isocyanate, hexyl isocyanate, butyl isocyanate, and the like may be used. Any of the amines and the isocyanates may be selected and used, and examples of combinations of amines and isocyanates to be used are suggested as follows. For example, a process may be performed with a combination of H6XDA and H6XDI, a combination of DAD and MDI, a combination of DAD and H6XDI, and a combination of hexamethylenediamine and H6XDI.

In each of the above embodiments, although a first film to be protected and a second film to be etched are shown to be arranged in a lateral direction, each of the films may be exposed at a surface of a substrate. For example, the films may be arranged in a vertical direction. That is, there is no limitation on the positional relationship between the films. The embodiments disclosed this time are to be considered as illustrative in all points and not restrictive. The above embodiments may be omitted, replaced, modified and/or combined in various forms without departing from the scope of the appended claims and the sprit thereof (Evaluation Test)

Evaluation tests performed in connection with the technique of the present disclosure will be described.

(Evaluation Test 1)

In evaluation test 1, adsorption energies of ammonia ($NH_3$), butylamine, hexylamine, and trimethylamine, which are molecules each including nitrogen (N), with respect to various molecules including Si were measured through simulation. Specifically, adsorption energies with respect to silicon (Si), silicon carbide (SiC), silicon nitride (SiN), $SiO_2CN$ (=SiOCN), and silicon oxide (Si) were measured.

Figure 13:
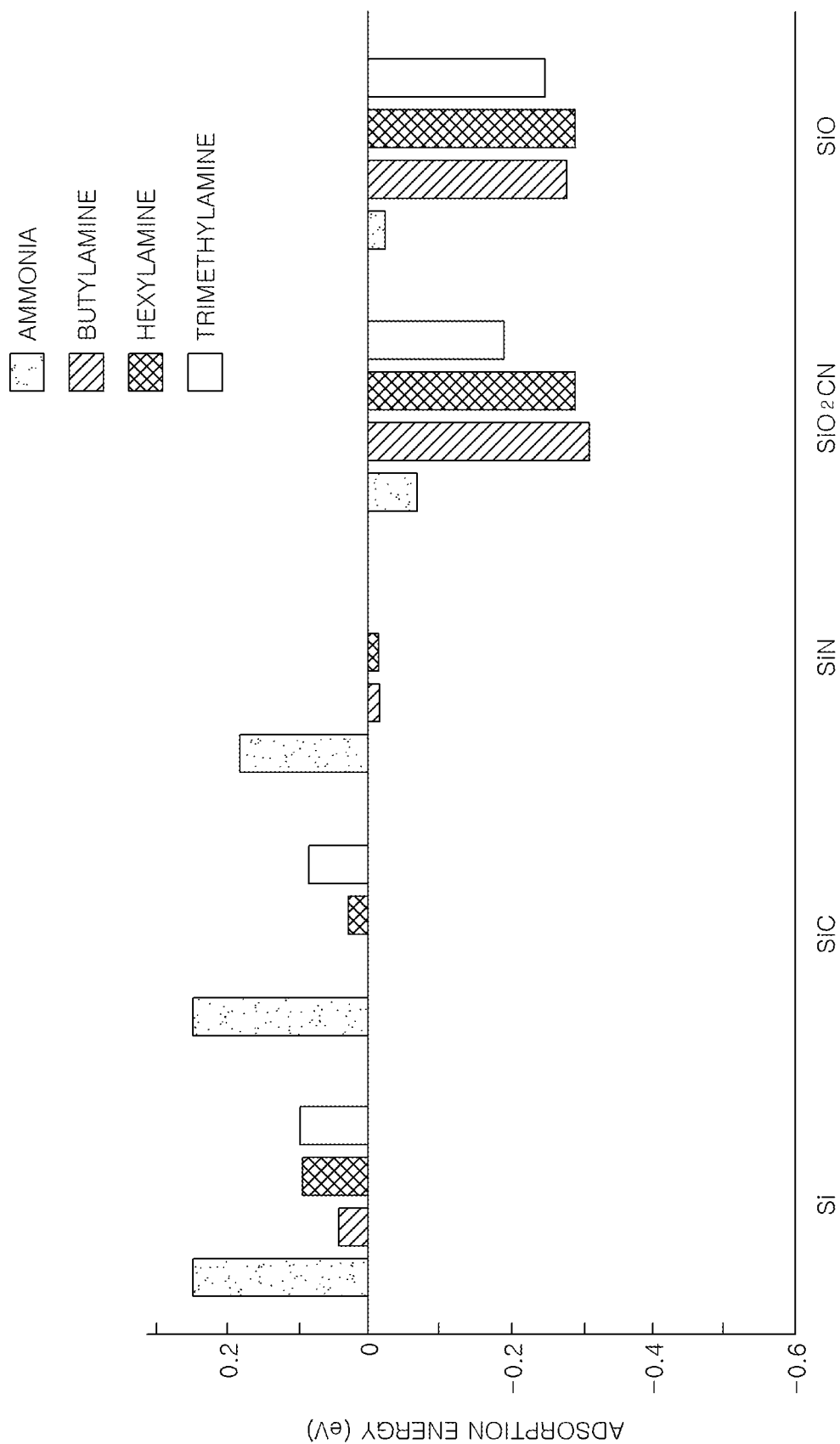
FIGS. 13 to 15 are graphs showing results of respective evaluation tests.

FIG. 13 is a bar graph showing results of evaluation test 1. A vertical axis of the graph shows adsorption energy (units: eV), and as the adsorption energy is decreased, the adsorption becomes easier. As shown in FIG. 13, the adsorption energies of respective amines with respect to Si, SiC, SiC, $SiO_2CN$, and SiO are different. Among these, the adsorption energies of the respective amines with respect to SiN, $SiO_2CN$, and SiO are negative, and the amine has an adsorption property with respect to these compounds. In particular, adsorption energy is low with respect to $SiO_2CN$ and SiO, and the respective amines are easily adsorbed. This is because an adsorption site of an amine corresponds to an oxygen (O) atom. On the other hand, the adsorption energies of respective amines with respect to Si and SiC are positive, and the adsorption properties of respective amines are low.

From the results of evaluation test 1, it can be seen that the adsorption properties of various amines are different according to types of silicon-containing films. Therefore, as described in the embodiment, it is estimated that, by using such difference in adsorption property of an amine, one film of the silicon-containing films may be protected and the other film thereof may be etched. The graph of FIG. 13 shows that the difference in adsorption energy between Si and each of SiOCN and SiO is particularly great. Therefore, it can be seen that it is possible to selectively etch a Si film using a protective film 23 described in the first embodiment. Furthermore, since the adsorption energy of an amine is low with respect to SiOCN, it can be seen that it is possible to sufficiently perform the sealing of pores 15 of a SiOCN film 13 described in the first embodiment.

(Evaluation Test 2)

In evaluation test 2, butylamine gas was supplied onto a substrate including different types of silicon-containing films on a surface thereof. Specifically, a gas was supplied onto a substrate on which a SiGe film, an α-Si film, a SiOC film, a SiN film, a polysilicon (poly-Si) film, a silicon oxide (Sift) film, and a SiOCN film were formed as the above-described silicon-containing films. An amount of butylamine adsorbed onto each film was measured using a gas chromatograph mass spectrometer (GC-MS).

Figure 14:
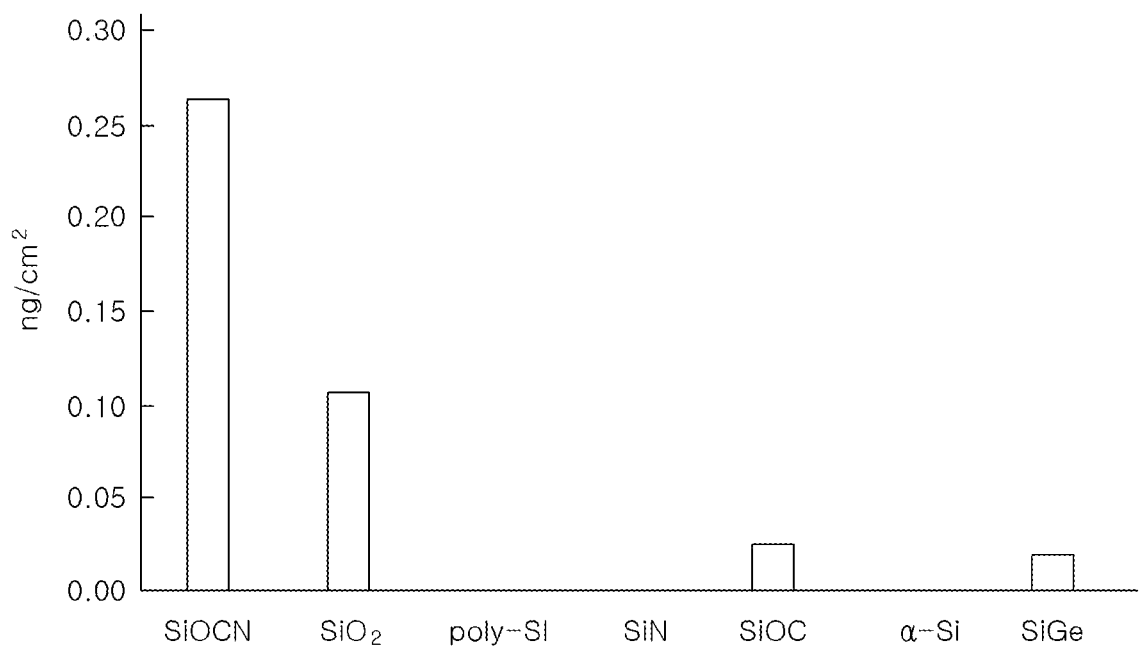

FIG. 14 is a graph showing results of evaluation test 2. As shown in FIG. 14, an amount of absorbed butylamine was different for each silicon-containing film. The adsorption amounts of the polysilicon film, the α-Si film, and the SiN film are approximately 0 $ng/cm^2$. The adsorption amounts of the SiOC film and the SiGe film are approximately in a range of 0.02 $ng/cm^2$ to 0.03 $ng/cm^2$, the adsorption amount of the silicon oxide film is approximately 0.10 $ng/cm^2$, and the adsorption amount of the SiOCN film is approximately 0.27 $ng/cm^2$.

Since the adsorption amounts of an amine are different according to the types of films, even in the results of evaluation test 2, as described in the first embodiment, it can be seen that, due to the difference in adsorption amount, as in evaluation test 1, selective etching may be performed using difference in thickness between protective films. That is, when a plurality of types of films having a sufficient difference in adsorption property of an amine are formed on a surface of a wafer W, only one film of the films can be selectively etched.

However, in the graph of FIG. 14, difference in adsorption property is relatively great between the polysilicon film and α-Si film not containing oxygen and the silicon oxide film and SiOCN film which are Si films containing oxygen. Therefore, it can be seen that the present technique is suitable for selectively etching the Si film between the Si film (polysilicon film and α-Si film) and a Si film containing oxygen. That is, in the process described in the first embodiment, only the polysilicon film 14 can be etched with high certainty.

In addition, from the graph of FIG. 14, it can be seen that an adsorption property of an amine is relatively greatly different between the silicon films containing oxygen. Specifically, for example, an adsorption amount of an amine is greatly different between silicon oxide and SiOCN. Therefore, in a process of etching the silicon oxide film 12 between the SiOCN film 13 and the silicon oxide film 12 described with reference to FIGS. 10A to 10C, only the silicon oxide film 12 can be etched with high certainty.

(Evaluation Test 3)

In evaluation test 3, amine gas and isocyanate gas were supplied onto a substrate including different types of silicon-containing films on a surface thereof. An adsorption amount of a compound having a urea bond in each film was measured through a GC-MS. Each of the above-described silicon-containing films is the same as each of the silicon-containing films in evaluation test 2.

Figure 15:
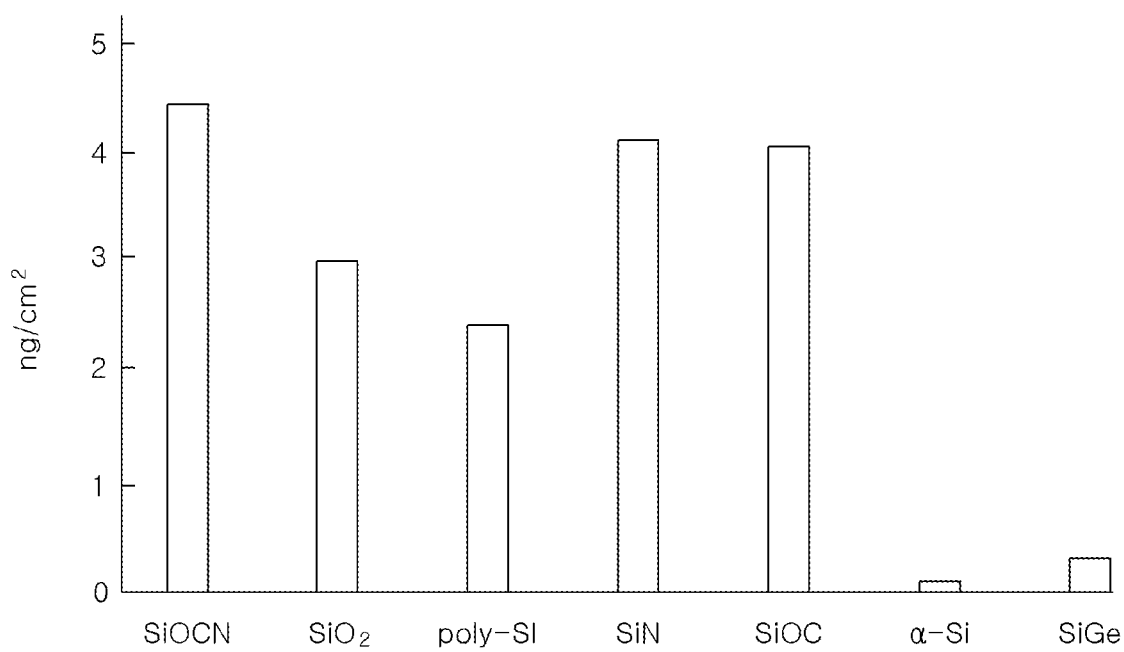

FIG. 15 is a graph showing results of evaluation test 3. As shown in FIG. 15, an adsorption amount of the compound was different for each silicon-containing film. Specifically, the adsorption amount was approximately 0.3 ng/cm$^2$ in SiGe, was approximately 0 ng/cm$^2$ in α-Si, was approximately 4 ng/cm$^2$ in SiOC and SiN, was approximately 2.5 ng/cm$^2$ in polysilicon, was approximately 3 ng/cm$^2$ in a silicon oxide film, and was approximately 4.5 ng/cm$^2$ in SiOCN. Due to difference in adsorption amount as such, even when protective films are formed using amine gas and isocyanate gas, it can be seen that the protective films may be formed on surfaces of different types of films so as to have different thickness. Therefore, the film including the protective film with a small thickness can be selectively etched, and thus, the processes illustrated in FIGS. 11A to 12 can be performed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An etching method comprising:
    supplying a protective film-forming gas including an amine gas to a substrate having a surface on which a first film and a second film are formed, the first film and the second film having respective properties of being etched by an etching gas, and forming a protective film to cover the first film such that the first film is selectively protected between the first film and the second film when the etching gas is supplied; and
    selectively etching the second film by supplying the etching gas to the substrate after the protective film is formed,
    wherein the second film is a silicon-containing film,
    wherein the first film and the second film are different types of silicon-containing films, and
    wherein the first film and the second film are films containing silicon and oxygen.

2. The etching method of claim 1, wherein the first film is a SiOCN film, and
    the second film is a silicon oxide film.

* * * * *